(12) United States Patent
Cumbie et al.

(10) Patent No.: US 12,713,915 B2
(45) Date of Patent: Aug. 18, 2026

(54) MICROCHANNEL STRUCTURES WITH BURIED STRUCTURES

(71) Applicant: Hewlett-Packard Development Company, L.P., Spring, TX (US)

(72) Inventors: Michael W. Cumbie, Corvallis, OR (US); Chien-Hua Chen, Corvallis, OR (US); Richard W. Seaver, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 418 days.

(21) Appl. No.: 18/495,622

(22) Filed: Oct. 26, 2023

(65) Prior Publication Data

US 2025/0140634 A1 May 1, 2025

(51) Int. Cl.
*H10W 40/22* (2026.01)
*H10W 40/25* (2026.01)

(52) U.S. Cl.
CPC ....... *H10W 40/226* (2026.01); *H10W 40/258* (2026.01)

(58) Field of Classification Search
None
See application file for complete search history.

(56) References Cited

U.S. PATENT DOCUMENTS

2005/0013117 A1* 1/2005 Barsun .................. H10W 40/43 257/E23.099
2006/0180924 A1* 8/2006 Andry .................. H01L 23/473 257/E23.098
2013/0314877 A1* 11/2013 Watanabe ............. H10W 40/00 257/687
2014/0264820 A1* 9/2014 Hu ...................... H10W 40/258 257/713
2023/0071418 A1* 3/2023 Hung .................... H10W 40/22

* cited by examiner

*Primary Examiner* — Khaja Ahmad
(74) *Attorney, Agent, or Firm* — Foley & Lardner LLP

(57) ABSTRACT

A structure includes a plate layer formed of a first material and a plurality of heatsink structures vertically extending from the plate layer. Each of the plurality of heatsink structures includes a bottom structure disposed on the plate layer and formed of the first material, a buried structure disposed on the bottom structure and formed of a second material, and a top structure disposed on the buried structure and formed of the first material. A plurality of microchannels are formed between the plurality of heatsink structures.

15 Claims, 5 Drawing Sheets

MICROCHANNEL STRUCTURES WITH BURIED STRUCTURES

BACKGROUND

Microfabrication and micromachining processes may refer to processes in which micrometer scale or smaller structures and devices can be formed. For example, microchannel structures correspond to various micrometer scale or smaller structures which may be implemented as heatsink structures for integrated circuits and device modules.

BRIEF DESCRIPTION OF THE DRAWINGS

Non-limiting examples of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
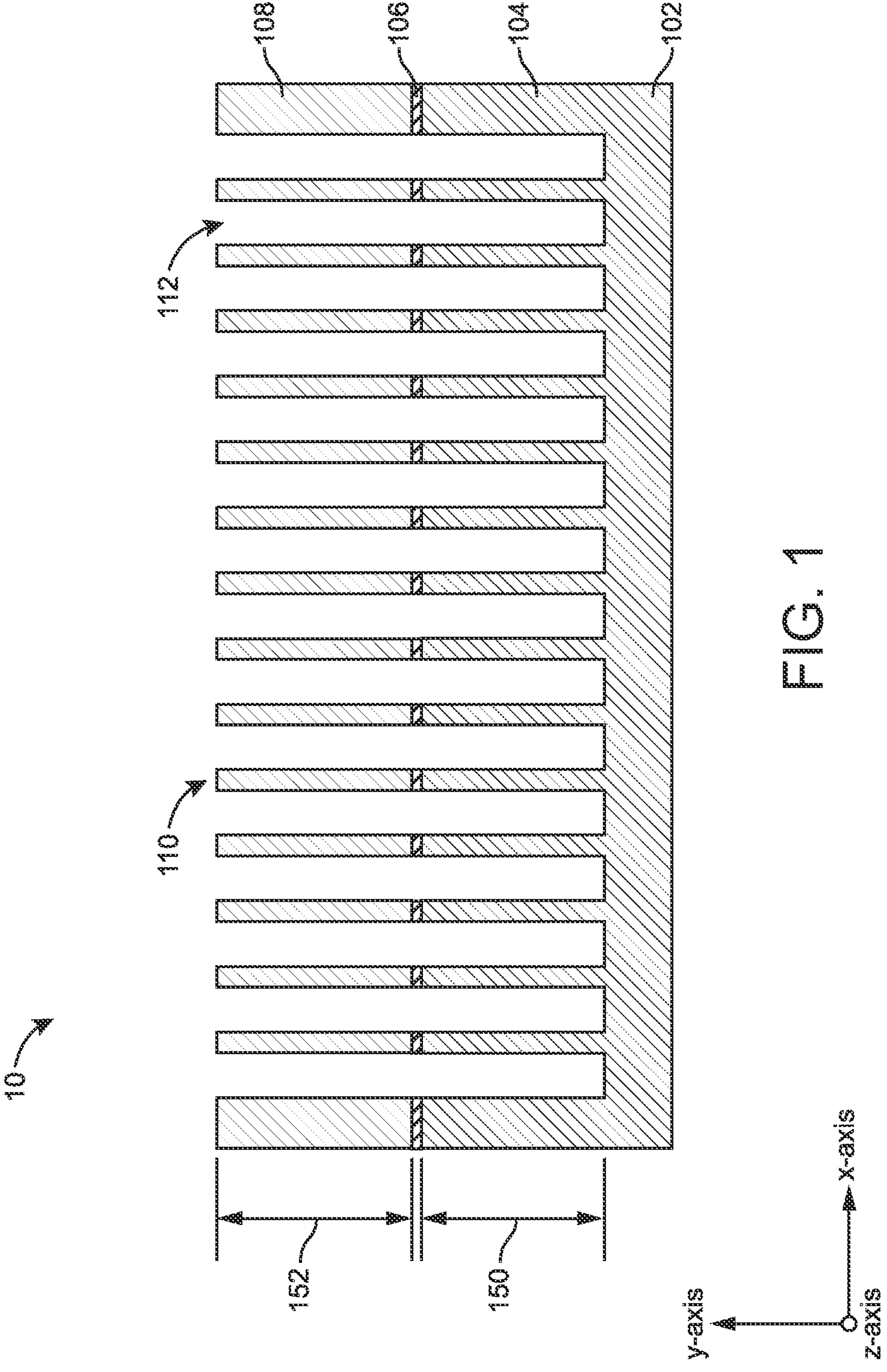
FIG. 1 is a side view of an example microchannel structure.

A microchannel structure (e.g., a silicon microchannel manifold (SMC)) may include a plate layer and heatsink structures vertically extending from the plate layer. Microchannels can be formed between the heatsink structures. In some examples, the plate layer and the heatsink structures can be formed of a first material (e.g., silicon), and each of the heatsink structures can include a buried structure formed of a second material. The microchannel structure can be attached to a device module (e.g., a graphic processing unit, a central processing unit, any component of integrated circuits, etc.) to remove heat generated therefrom. For example, the microchannel structure may be a liquid cool heatsink. The heatsink structures can absorb heat from the device module, and the heat can be dissipated through cooling fluid flowing in the microchannels.

The depths (or heights) of the heatsink structures and the microchannels can be increased to prevent a significant pressure drop of the cooling fluid and increase the cooling efficiency. However, when the depths (or heights) of the heatsink structures and the microchannels are increased, it can be challenging to form the structures uniformly across the microchannel structure. For example, when the depths (or heights) of the heatsink structures and the microchannels are increased, an etch profile of the etched structure (e.g., the microchannels) may have a variation in height across the microchannel structure. Such a non-uniformity can result in reduced performances of the microchannel structure. For example, a variation in depth (or height) of the heatsink structures and the microchannels can causes a variation in the pressure drop, which can hinder the flow of cooling fluid and reduce the efficiency of the microchannel structure to remove heat from the device module.

Techniques disclosed herein can provide microchannel structures including buried structures formed in heatsink structures and methods of forming the same. The buried structure allows the heatsink structures and thus the microchannels to be formed with an increased uniformity. With the buried structure serving as an etch stop layer, the heatsink structures can be fully (and/or uniformly) etched to the buried structure with an increased uniformity (e.g., a reduced variation in height of the etch profile), and therefore the microchannels can be formed with an increased uniformity. This increases the uniformity in pressure drop and thus the cooling efficiency of the microchannel structure to remove heat.

In some examples, the uniformity of the etch profile can be increased by forming the buried structure at a lower portion of the heatsink structures. This allows more of the heatsink structures to be etched with the buried structure serving as an etch stop layer, thereby increasing the overall uniformity of the heatsink structures as well as the microchannels. In some examples, the buried structure can include metal or any other materials whose thermal conductivity is as good as silicon (e.g., gold, silver, tantalum, etc.) while providing etch selectivity with respect to the adjacent structures (e.g., heatsink structures).

Reference will now be made to the figures. Although the figures and aspects of the disclosure may show or describe structures herein as having a particular shape, it should be understood that such shapes are merely illustrative and should not be considered limiting to the scope of the techniques described herein. For example, the techniques described herein may be implemented in any shape or geometry for any material or layer to achieve desired results.

FIG. 1 is a side view of an example microchannel structure 10. The structure 10 includes a plate layer 102 and a plurality of heatsink structures 110. Each of the plurality of heatsink structures 110 include a bottom structure 104, a buried structure 106, and a top structure 108. The structure 10 includes a plurality of microchannels 112 formed between the plurality of heatsink structures 110.

The plurality of heatsink structures 110 can be formed on the plate layer 102, vertically extending therefrom. Each of the plurality of heatsink structures 110 can include the buried structure 106 therein. As shown, in each of the plurality of heatsink structures 110, the bottom structure 104 can be disposed above the plate layer 102, the buried structure 106 can be disposed above the bottom structure 104, and the top structure 108 can be disposed above the buried structure 106.

In some examples, one of a height (y-axis), a width (x-axis), a pitch (x-axis), or a shape of the plurality of heatsink structures 110 can be uniform (or substantially uniform with a variation of around 15% or less) across the plurality of heatsink structures 110. For example, the width of the plurality of heatsink structures 110 can be uniform across the plurality of heatsink structures 110. The width of the plurality of heatsink structures 110 can range from 30 μm to 70 μm. For example, the width of each of the plurality of heatsink structures 110 may be 50 μm. The pitch of the plurality of heatsink structures 110 can be uniform across the plurality of heatsink structures 110. The pitch of the plurality of heatsink structures 110 can range from 70 μm to 130 μm. For example, the pitch of the plurality of heatsink structures 100 may be 100 μm. The height of the plurality of heatsink structures 110 can be uniform across the plurality of heatsink structures 110. The height of the plurality of heatsink structures 110 can range from 500 μm to 800 μm. For example, the height of each of the plurality of heatsink structures 110 can be 600 μm.

In some examples, one of a depth (y-axis), a width (x-axis), or a shape of the plurality of microchannels 112 can be uniform (or substantially uniform with a variation of around 15% or less) across the plurality of microchannels 112. For example, the depth of the plurality of microchannels 112 can be uniform across the plurality of microchannels 112. The depth of each of the plurality of microchannels 112 can range from 500 μm to 800 μm. For example, the depth of each of the plurality of microchannels 112 may be 600 μm. The width of the plurality of microchannels 112 can be uniform across the plurality of microchannels 112. The width of each of the plurality of microchannels 112 can range from 30 μm to 70 μm. For example, the width of each of the plurality of microchannels 112 may be 50 μm. Although not depicted in FIG. 1, a length (z-axis) of the plurality of microchannels 112 (and/or the heatsink structures 110) can be designed to be uniform (or substantially uniform) in the length direction (z-axis).

The vertical position (e.g., y-axis) of the buried structure 106 can be defined as a first distance 150, which is a distance from the surface of the plate layer 102 (e.g., from a top or bottom surface of the plate layer 102) to the buried structure 106. The buried structure 106 of the plurality of heatsink structures 110 can be uniformly (or substantially uniform) disposed at the first distance 150 above from the surface of the plate layer 102. In some examples, the first distance 150 can range from 50 μm to 200 μm. For example, each of the buried structures 106 can be disposed at the first distance 150 of 50 μm (or for example, 100 μm, 150 μm, 200 μm, etc.). In some examples, the first distance 150 can be smaller than 50 μm. For example, each of the buried structures 106 can be disposed at the first distance 150 of 30 μm. In some examples, the vertical position (e.g., y-axis) of the buried structure 106 can be defined as a second distance 152, which is a distance from the surface of the top structure 108 (e.g., a top or bottom surface of the top structure 108) to the buried structure 106. The buried structures 106 of the plurality of heatsink structures 110 can be uniformly (or substantially uniform) disposed at the second distance 152 below from the surface of the top structure 108. In some examples, the second distance 152 can range from 350 μm to 550 μm. For example, each of the buried structures 106 can be disposed at the second distance 152 of 400 μm. In some examples, a thickness of the buried structure 106 can range from 0.5 μm to 3 μm. For example, the thickness of the buried structure 106 may be 1.5 μm.

In some examples, a thickness of the plate layer 102 can range from 50 μm to 150 μm. In some examples, the number of the plurality of heatsink structures 110 may be several hundreds. For example, the number of the plurality of heatsink structures 110 may be, but not limited to, 100, 300, 500, 700, etc.

The plate layer 102, the bottom structure 104, and the top structure 108 may be formed of a first material. The first material may include, but not limited to, silicon, etc. For example, the plate layer 102, the bottom structure 104, and the top structure 108 may be formed of silicon, and the structure 10 may be a silicon microchannel manifold (SMC). In some examples, any two of the plate layer 102, the bottom structure 104, and the top structure 108 may include different materials. For example, the first material may include various materials whose thermal conductivity is as good as that of silicon, and each of the plate layer 102, the bottom structure 104, and the top structure 108 may include different materials.

The buried structure 106 may be formed of a second material. The second material may be any materials that can have etching selectivity with respect to adjacent structures (e.g., the plate layer 102, the bottom structure 104, the top structure 108, etc.) or materials thereof. For example, the second material may include, but not limited to, silicon dioxide, thermal silicon oxide, silicon nitride, silicon carbide, gallium oxide, any metal (e.g., gold, silver, etc.), metal oxide, ceramic, etc.

Figure 4:
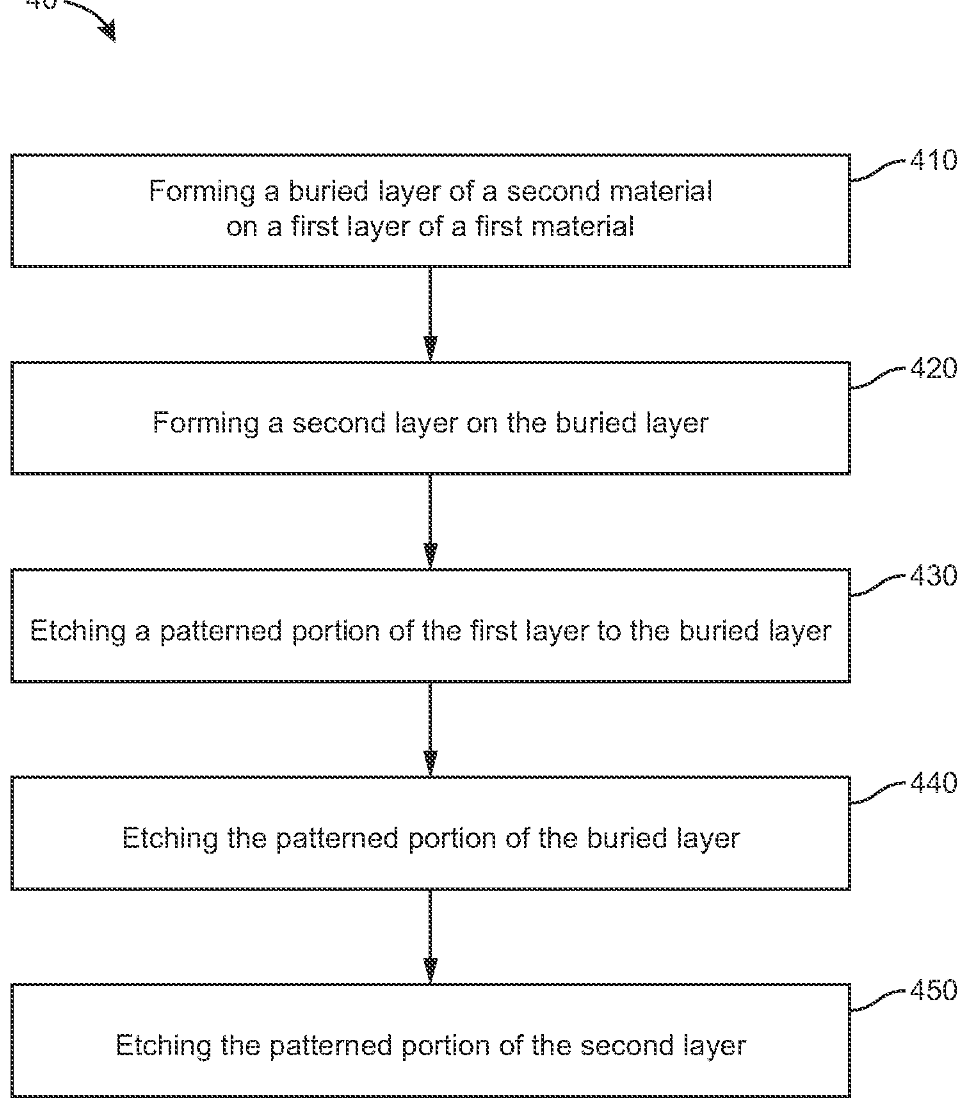
FIG. 4 is a flowchart of an example process.
Figure 5:
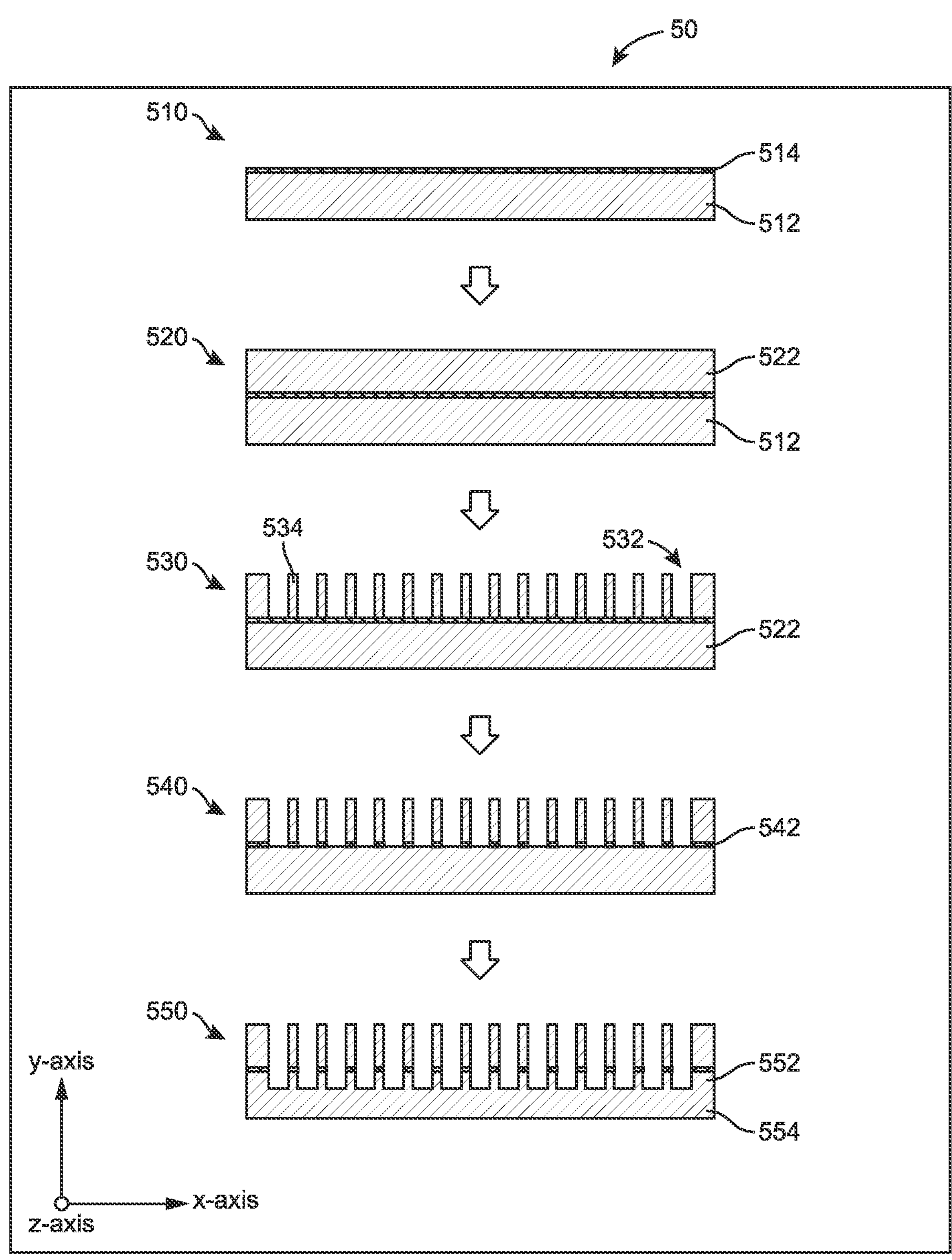
FIG. 5 is an example flow diagram to form an example microchannel structure.

In some examples, the plurality of microchannels 112 can be formed by etching a portion of the plate layer 102, a portion of a bottom layer (to form the bottom structure 104), a portion of a buried layer (to form the buried structure 106), and a portion of a top layer (to form the top structure 108), as discussed in greater detail with respect to FIG. 4 and FIG. 5.

Figure 2:
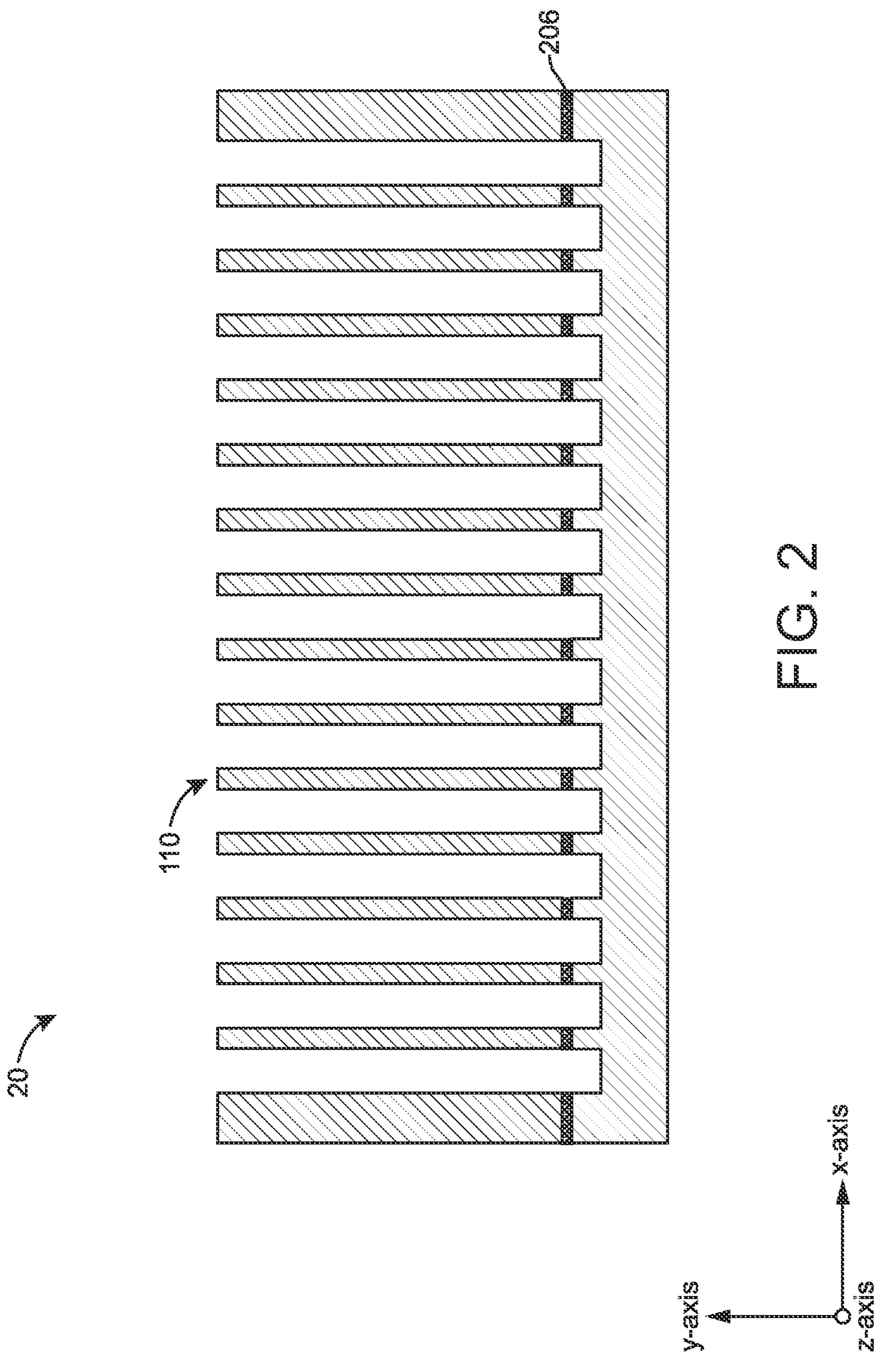
FIG. 2 is a side view of an example microchannel structure.

FIG. 2 is a side view of an example microchannel structure 20. The structure 20 may be an alternative of the structure 10, with buried structures 206 disposed at a lower portion of the heatsink structures 110. The vertical location (e.g., the first distance 150, the second distance 152) of the buried structures 206 can vary depending on the second material of the buried structure 206. For example, when the second material includes silicon dioxide, the buried structure 206 can be located in a middle portion of the plurality of heatsink structures 110 (e.g., as shown in FIG. 1). For example, when the second material includes metal or any other materials whose thermal conductivity is as good as that of the first material, the buried structure 206 can be located in a lower portion of the plurality of heatsink structures 110 (e.g., as shown in FIG. 2). For example, the first distance 150 of the buried structure 206 may be smaller than 50 μm.

Figure 3:
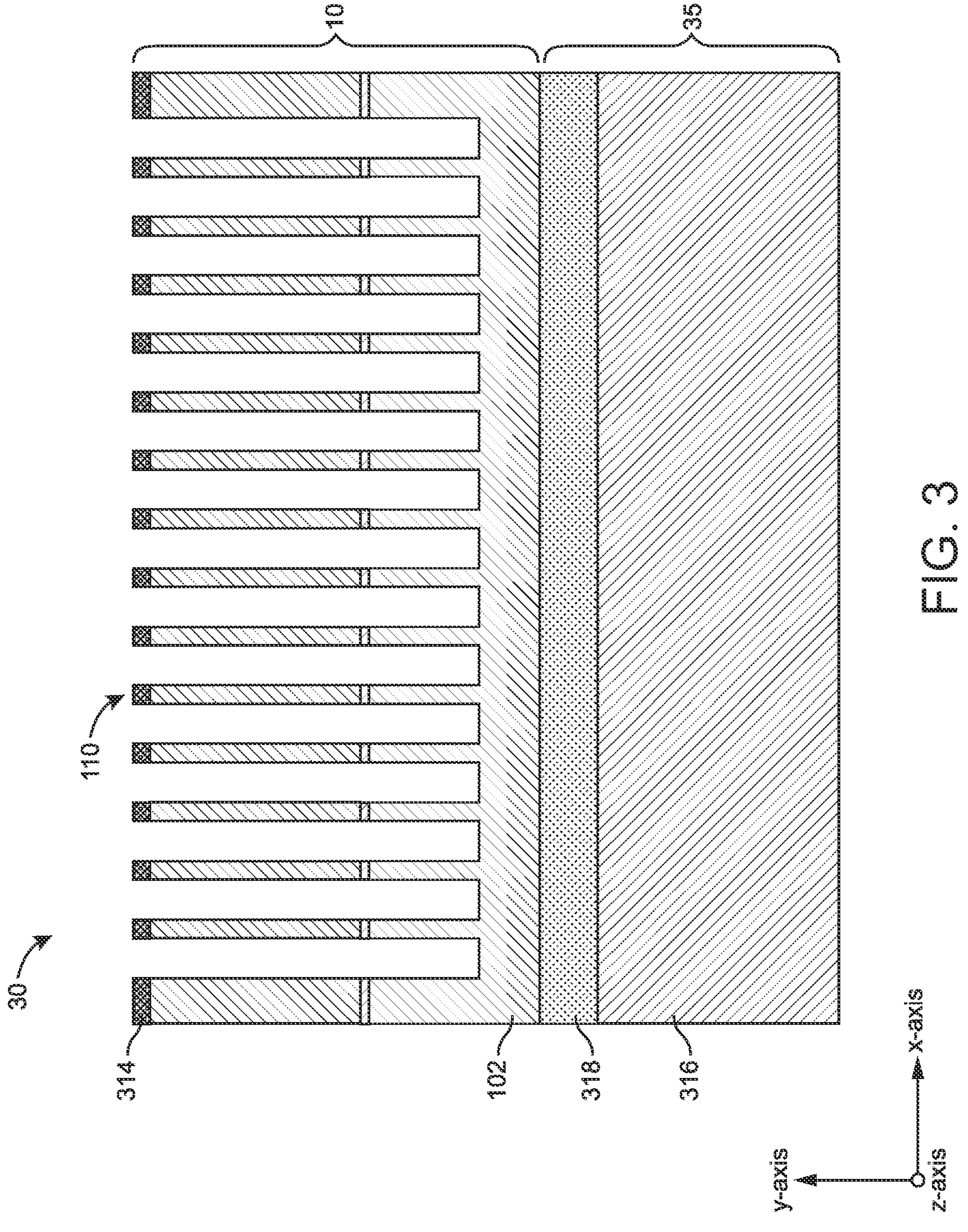
FIG. 3 is a side view of an example device including an example microchannel structure.

FIG. 3 is a side view of an example device 30 including an example microchannel structure. More specifically, FIG. 3 depicts an example implementation of the structure 10 (or the structure 20), in which the structure 10 is attached to a device interface 35. The device interface 35 includes a device layer 316 and a thermal interface material (TIM) 318. Each of the heatsink structures 110 can additionally include a cap structure 314.

The device layer 316 may be or include a device module (e.g., a graphic processing unit, a central processing unit, any component of integrated circuits, or any other devices/structures). In some examples, the device layer 316 may include a total-thickness-variation (TTV) silicon. As shown, the TIM 318 can be disposed between the device layer 316 and the structure 10 (e.g., the plate layer 102). The TIM 318 may be or include any structure and/or material that can transfer heat from the device layer 316 to the structure 10. For example, the TIM 318 may include, but not limited to, a thermal grease, a thermal pad, a gap filler, etc. that can be formed of high thermal-conductivity materials (e.g., silicon, zinc oxide, silver, etc.).

The cap structure 314 may be substantially similar to or identical to the TIM 318. In some examples, the device interface 35 (e.g., a device in the device layer 316) can be coupled to a second device in an integrated circuit or a multi-chip-module (MCM) assembly. When such a second device is connected to the device 30, for example through a top portion of the device 30, the second device (and/or the integrated circuit, the MCM assembly, etc.) can be attached to the device 30 through the cap structure 314. In this way, the cap structure 314 can transfer heat from the second device (and/or the integrated circuit, the MCM assembly, etc.) to the heatsink structures 110 and the microchannels formed therebetween, thereby serving as a TIM for the second device.

FIG. 4 is a flowchart of an example process 40. FIG. 5 is an example flow diagram 50 to form an example microchannel structure (e.g., the structure 10, the structure 20, a structure 550). The process 40 may be associated with an example structure at various fabrication stages shown in FIG. 5. It is noted that the process 40 and the flow diagram 50 are merely an example, and are not intended to limit the present disclosure. Accordingly, it should be understood that additional operations and/or flows may be provided before, during, or after any of the process 40 of FIG. 4, and/or any of the flow diagram 50 of FIG. 5, that any of the process 40 of FIG. 4, and/or any of the flow diagram 50 of FIG. 5 may be omitted, and that some other operations or flow diagrams may be briefly described herein.

In a brief overview, the process 40 can start with operation 410 of forming a buried layer of a second material on a first layer of a first material. The process 40 can continue to operation 420 of forming a second layer on the buried layer. The process 40 can continue to operation 430 of etching a patterned portion of the first layer to the buried layer. The process 40 can continue to operation 440 of etching the patterned portion of the buried layer. The process 40 can continue to operation 450 of etching a patterned portion of the second layer.

Corresponding to operation 410 of FIG. 4, a structure 510 of FIG. 5 can be formed, in which a buried layer 514 of a second material is formed on a first layer 512 of a first material. The first material may include, but not limited to, silicon or any material whose thermal conductivity is as good as silicon, etc. For example, the first material may be the first material discussed with respect to FIG. 1. In some examples, the first layer 512 may be a semiconductor substrate, such as a bulk semiconductor, a semiconductor wafer, a semiconductor substrate, or the like. In some examples, the first layer 512 may be doped (e.g., with a p-type or an n-type dopant) or undoped. In some examples, a thickness of the first layer 512 can range from 50 μm to 600 μm.

The buried layer 514 of the second material can be formed on the first layer 512. The second material may be any materials that can have etching selectivity with respect to adjacent layers (e.g., the first layer 512, etc.). For example, the second material may include, but not limited to, silicon dioxide, thermal silicon oxide, silicon nitride, silicon carbide, gallium oxide, any metal (e.g., gold, silver, etc.) or metal oxide. For example, the second material may be the second material discussed with respect to FIG. 1. The buried layer 514 can be formed on the first layer 512 by growing, depositing, spin coating, placing, or otherwise forming the second material on the first layer 512. In some examples, the buried layer 514 can be formed by oxidizing the first layer 512.

In some examples, the structure 510 may be an oxide wafer (e.g., silicon/oxide) or a wafer of the first material (e.g., silicon). The first layer 512 may be a portion of the oxide wafer (e.g., a semiconductor portion) or a portion of the silicon wafer. The buried layer 514 may be a portion of the oxide wafer or a portion of the silicon wafer (e.g., an insulator layer). In some examples, the buried layer 514 may be formed by a compression bonding or a eutectic bonding. In some examples, a thickness of the buried layer 514 can range from 0.5 μm to 3 μm.

Corresponding to operation 420 of FIG. 4, a structure 520 of FIG. 5 can be formed, in which a second layer 522 of the first material is formed on the buried layer 514. The second layer 522 can be formed by growing, depositing, placing, or otherwise forming the first material on the buried layer 514. In some examples, the first material of the second layer 522 may be different from the first material of the first layer 512. In some examples, the second layer 522 may be substantially similar to or identical to the first layer 512. For example, the second layer 522 may be a semiconductor substrate, such as a bulk semiconductor, a semiconductor wafer, a semiconductor substrate, an oxide wafer (e.g., silicon/oxide) or the like. In some examples, the structure 520 can be formed by bonding the structure 510 and the second layer 522. For example, the structure 520 can be formed by bonding two wafers such that the insulating layers of the two wafers are bonded to form the buried layer 514. In some examples, a thickness of the second layer 522 can range from 50 μm to 300 μm. In some examples, the second layer 522 may be doped (e.g., with a p-type or an n-type dopant) or undoped. In some examples, the second layer 522 can include a device layer, can be used to form a device, or can be connected to a device layer. In some examples, the structure 520 may be formed by a compression bonding or a eutectic bonding of the first layer 512, the second layer 522, and the second material for the buried layer 514.

Corresponding to operation 430 of FIG. 4, a structure 530 of FIG. 5 can be formed, in which a patterned portion 532 of the first layer 512 is etched to the buried layer 514. Prior to etching the patterned portion 532 of the first layer 512, a patterned mask (not shown) can be formed on the first layer 512 to define the patterned portion 532. The mask layer can be formed by, for example, spin-coating, placing, growing, or otherwise forming over the first layer 512. The mask layer may be or include a light-sensitive material (e.g., photoresist) to pattern the first layer 512. The patterned portion 532 of the first layer 512 can be etched to the buried layer 514, thereby forming a top structure 534. The patterned portion 532 can be removed by directionally etching the patterned portion 532 of the first layer 512. For example, reactive ion etching (RIE) (or a deep RIE, etc.) can be used to etch the patterned portion 532 of the first layer. When the etching of the patterned portion 532 of the first layer 512 reaches the buried layer 514, the etchant does not etch the buried layer 514 or etch with a slower rate (compared with the etching of the patterned portion 532 of the first layer 512). That is, the buried layer 514 can serve as an etch stop that allows the etchant to fully (and/or uniformly) etch the patterned portion 532 of the first layer 512 while protecting the underlying layer (e.g., the second layer 522). As shown, the patterned portion 532 of the first layer 512 can define a first portion of microchannels (e.g., an upper portion of the microchannels 112). This allows for a uniform (or substantially uniform) etch profile of the patterned portion 532 of the first layer 512, and thus a uniform (or substantially uniform) profile of the microchannels.

In some examples, the top structure 534 can be formed such that one of a height (or a depth), a width, or a shape of the top structure 534 is uniform (or substantially uniform) across the structure 530. In some examples, the patterned portion 532 (e.g., the etched portion) of the structure 530 can be formed such that one of a depth (or a height), a width, or a shape of the patterned portion 532 (e.g., the etched portion) is uniform (or substantially uniform) across the structure 530. In some examples, the etched depth (or the height of the top structure 534) may range from 350 μm to 450 μm. In some examples, the etched depth (or the height of the top structure 534) may range from 450 μm to 550 μm, for example, when the buried layer 514 includes metal or metal oxide.

Corresponding to operation 440 of FIG. 4, a structure 540 of FIG. 5 can be formed, in which the patterned portion 532 of the buried layer 514 is etched, thereby forming a buried structure 542. The patterned portion 532 of the buried layer 514 can be removed by selectively etching the patterned portion 532 of the buried layer 514. For example, reactive ion etching (RIE) can be used to etch the patterned portion 532 of the buried layer 514. For example, an etchant that can selectively etch the second material of the buried layer 514 without etching the first material of the first layer 512 and/or the second layer 522.

In some examples, the buried structure 542 can be formed such that one of a height, a width, or a shape of the buried structure 542 is uniform (or substantially uniform) across the structure 540. In some examples, the patterned portion 532 (e.g., the etched portion) of the structure 540 can be formed such that one of a depth, a width, or a shape of the patterned portion 532 (e.g., the etched portion) of the structure 540 is uniform (or substantially uniform) across the structure 540. In some examples, a height of the buried structure 542 may range from 0.5 μm to 3 μm.

Corresponding to operation 450 of FIG. 4, a structure 550 of FIG. 5 can be formed, in which the patterned portion 532 of the second layer 522 is etched, thereby forming a bottom structure 552 and a plate layer 554. As shown, the top structure 534, the buried structure 542, and the bottom structure 552 can define heatsink structures (e.g., the heatsink structures 110), and the patterned portion 532 (or the etched portion in the structure 550) formed between the heatsink structures can define microchannels (e.g., the microchannels 112). The patterned portion 532 of the second layer 522 can be removed by etching a predetermined thickness of the patterned portion 532 of the second layer 522. For example, reactive ion etching (RIE) can be timed to etch the patterned portion 532 of the second layer 522. For example, an etchant can be applied to etch the patterned portion 532 of the second layer 522. As shown, the patterned portion 532 of the second layer 522 can define a second portion of microchannels (e.g., a lower portion of the microchannels 112).

In some examples, the bottom structure 552 can be formed such that one of a height (or a depth), a width, or a shape of the bottom structure 552 is uniform (or substantially uniform) across the structure 550. In some examples, the patterned portion 532 (e.g., the etched portion) of the structure 550 can be formed such that one of a height (or a depth), a width, or a shape of the patterned portion 532 (e.g., the etched portion) of the structure 550 is uniform (or substantially uniform) across the structure 550. In some examples, the height of the bottom structure 552 can range from 50 μm to 200 μm. In some examples, the etched depth (or the height of the bottom structure 552) can be smaller than 50 μm, for example, when the buried layer 514 includes metal or metal oxide.

In some examples, prior to etching the patterned portion 532 of the second layer 522, the top structure 534 and/or the buried structure 542 can be coated with a passivation film. The passivation film can be deposited on sidewalls of the top structure 534 and/or the buried structure 542. The passivation film can provide protection to the underlying structures (e.g., the top structure 534 and/or the buried structure 542) and prevent the etchant for the second layer 522 from etching the underlying structures (e.g., the top structure 534 and/or the buried structure 542). In some examples, when the passivation film is deposited on the surface of the second layer 522, prior to the etching of the patterned portion 532 of the second layer 522, directional etching (e.g., biased etching) can be used to etch the passivation film on the surface of the second layer 522 while not affecting the passivation film on the sidewalls of the top structure 534 and/or the buried structure 542.

It should be understood that examples described herein should be considered in a descriptive sense and not for purposes of limitation. Descriptions of features or aspects within each example should be considered as available for other similar features or aspects in other examples. While examples have been described with reference to the figures, it will be understood that various changes in form and details may be made therein without departing from the spirit and scope as defined by the following claims.

The preceding description has been presented to illustrate and describe examples of the principles described. This description is not intended to be exhaustive or to limit these principles to any precise form disclosed. Many modifications and variations are possible in light of the description. Therefore, the foregoing examples provided in the figures and described herein should not be construed as limiting of the scope of the disclosure, which is defined in the Claims.

The disclosure has been described above with reference to the various examples. However, it is to be understood by those of ordinary skill in the art that various modifications may be made in form and detail without departing from the scope of the disclosure as defined by the appended claims and their equivalents.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, etc. Thus, such conditional language is not generally intended to imply that an example necessarily include logic for deciding, with or without other input or prompting, whether these features, elements, etc. are included or are to be performed in any particular example. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various examples, it can be understood that various omissions, substitutions, and changes in the form and details of the devices illustrated can be made without departing from the spirit of the disclosure. As can be recognized, certain examples described herein can be embodied within a form that does not provide all of the features and benefits set forth herein, as some features can be used or practiced separately from others.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. Furthermore, in those instances where a convention analogous to "one of A, B, and C, etc." is used, in general such a construction is intended in the sense one having skill in the art would understand the convention (e.g., "a system having one of A, B, and C" would include but not be limited to systems that have A alone, B alone, C alone, A and B together, A and C together, B and C together, and/or A, B, and C together, etc.). In those instances, where a convention analogous to "one of A, B, or C, etc." is used, in general such a construction is intended in the sense one having skill in the art would understand the convention (e.g., "a system having one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

What is claimed:

1. A microchannel structure comprising:

a plate layer formed of a first material; and a plurality of heatsink structures vertically extending from the plate layer, each of the plurality of heatsink structures comprising:

a bottom structure disposed on the plate layer and formed of the first material;

a buried structure disposed on the bottom structure and formed of a second material, wherein the second material has etching selectivity with respect to the first material; and a top structure disposed on the buried structure and formed of the first material, wherein a plurality of microchannels are formed between the plurality of heatsink structures, and wherein the first material comprises silicon.

2. The microchannel structure of claim 1, wherein one of a depth, a width, or a shape of the plurality of microchannels is substantially uniform across the plurality of microchannels.

3. The microchannel structure of claim 1, wherein one of a depth, a width, or a shape of the plurality of heatsink structures is substantially uniform across the plurality of heatsink structures.

4. The microchannel structure of claim 1, wherein the buried structure is disposed at a first distance from the plate layer.

5. The microchannel structure of claim 4, wherein the first distance ranges from 50 μm to 200 μm.

6. The microchannel structure of claim 4, wherein the first distance is smaller than 50 μm.

7. A structure comprising:

a plate layer formed of a first material; and a plurality of heatsink structures vertically extending from the plate layer and formed of the first material, each of the plurality of heatsink structures comprising a buried structure disposed therein at a first distance from the plate layer, the buried structure formed of a second material, wherein the second material has etching selectivity with respect to the first material;

wherein a plurality of microchannels are uniformly disposed between the plurality of heatsink structures, and wherein the first material comprises silicon.

8. The structure of claim 7, wherein:

the first distance ranges from 50 μm to 200 μm, and the second material comprises one of silicon dioxide, silicon nitride, silicon carbide, or gallium oxide; or the first distance is smaller than 50 μm, and the second material comprises metal.

9. The structure of claim 7, comprising a thermal interface material disposed above each of the plurality of heatsink structures.

10. The structure of claim 7, wherein a height of the plurality of heatsink structures ranges from 500 μm to 800 μm.

11. The structure of claim 7, wherein a width of the plurality of heatsink structures ranges from 30 μm to 70 μm, and wherein a pitch of the plurality of heatsink structures ranges from 70 μm to 130 μm.

12. The structure of claim 7, wherein a thickness of the buried structure ranges from 0.5 μm to 3 μm.

13. A structure comprising:

a plate layer formed of a first material;

a buried layer disposed on the plate layer and formed of a second material, wherein the second material has etching selectivity with respect to the first material;

a top layer disposed on the buried layer and formed of the first material; and a plurality of microchannels formed by etching of a portion of the plate layer, a portion of the buried layer, or a portion of the top layer, wherein one of a depth, a width, or a shape of the plurality of microchannels is substantially uniform across the plurality of microchannels, and wherein the first material comprises silicon.

14. The structure of claim 13, wherein the second material comprises one of silicon dioxide, silicon nitride, silicon carbide, gallium oxide, or metal.

15. The structure of claim 13, wherein the etching of a portion of the plate layer comprises first etching to etch the portion of the top layer and second etching to etch the portion of the plate layer.

* * * * *